(12) United States Patent
Brahmadathan et al.

(10) Patent No.: US 9,159,423 B1
(45) Date of Patent: Oct. 13, 2015

(54) ROBUST ERASE PAGE DETECTION LOGIC FOR NAND FLASH MEMORY DEVICES

(71) Applicant: Cadence Design Systems, Inc., San Jose, CA (US)

(72) Inventors: Sandeep Brahmadathan, Bangalore (IN); Srinivas Suresh Revankar, Bangalore (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 376 days.

(21) Appl. No.: 13/631,171

(22) Filed: Sep. 28, 2012

(51) Int. Cl.
*G11C 16/06* (2006.01)
*G11C 16/04* (2006.01)

(52) U.S. Cl.
CPC ............ *G11C 16/04* (2013.01); *G11C 16/0483* (2013.01)

(58) Field of Classification Search
CPC .... G11C 16/04; G11C 16/06; G11C 16/0483; G11C 29/76; G11C 29/82; G11C 29/789
USPC ............ 365/185.01, 185.02, 185.12, 185.17, 365/185.33, 185.09
See application file for complete search history.

(56) References Cited

U.S. PATENT DOCUMENTS 6,988,175 B2 * 1/2006 Lasser ........................... 711/156
7,450,425 B2 * 11/2008 Aritome .................. 365/185.19

* cited by examiner

*Primary Examiner* — Tha-o H Bui
(74) *Attorney, Agent, or Firm* — Sawyer Law Group, P.C.

(57) ABSTRACT

The present invention provides a method and system to reduce the impact of errors introduced in flash devices while providing improved system performance through optimized activities with limited impact to overhead using a predetermined threshold value or threshold device value. In an embodiment, a device threshold value is compared with the cumulative number of data bits having a zero value of a target page and an error type of the target page is assessed to determine whether the target page is available to be written to. Therefore for a highly effective method for is provided for determining the availability of a page, having a block address and page address, to be identified, in one instance, as being an erased page that is available to be written to.

23 Claims, 3 Drawing Sheets

ROBUST ERASE PAGE DETECTION LOGIC FOR NAND FLASH MEMORY DEVICES

FIELD OF THE INVENTION

The present invention relates generally to Flash memory devices, and more particularly, to effecting improvements by minimizing the effects of error inherency and disturbance events in flash memory devices.

BACKGROUND OF THE INVENTION

In typical computer-related devices, there is often a flash memory that involves a NAND-based architecture. The NAND-based architecture typically comprises one or more flash memory chips, a memory controller for executing flash translation code (FTL) code in Read-Only Memory (ROM), a Static Read-Access Memory (SRAM) for maintaining the address mapping information, and a host interface for communicating, such as that of a Personal Computer Memory Card International Association (PCMCIA) for example. In operation, a flash memory device is able to issue commands in association with logical sector addresses of and data resident on the flash device. Within the architecture of the device, commands of read, write, program and/or erase in relation to physical locations, or sector addresses, of the data (i.e., operational commands) are performed via the FTL.

Flash memory is a popular type of non-volatile computer storage chip having a NAND-based architecture. Memories having NAND-based architectures are typically found in memory cards, Universal Serial Bus (USB) flash drives, solid-state drives, and similar products, for general storage and transfer of data. NAND flash memory is also often used to store configuration data in numerous digital products. Example device applications of flash memory include personal computers, PDAs, digital audio players, digital cameras, mobile phones, synthesizers, solid state storage, video games, scientific instrumentation, industrial robotics, routers, communication devices, programmable devices, medical electronics, and so on. Flash memory is popular in applications for consumers because of the robustness of the devices (i.e., shock and water resistance versus disc drives) as well as since flash memory offers fast read access times, as Its mechanical shock resistance helps explain its popularity over hard disks in portable devices; consequently, consumers often expect long-term performance from such devices and are often unfamiliar with the flash endurance limits and disturbance issues that may arise.

Typically, a flash memory drive is used to provide non-volatile storage to computer-based systems (such as a PC) by connection via a Universal Serial Bus (USB) or other bus. NAND is a common type of flash memory. Flash memory may be electrically erased and reprogrammed. Typically, the NAND-based architecture flash memory is programmed to read and be written to in blocks, or pages, where it may be the entirety of the block that is erased when new data is written to the block. In NAND memory (also used herein as "flash memory"), it is understood that before data can be programmed (or written to) a page, typically the page needs to have been erased or be otherwise available for writing. As a result fairly large blocks of data are often erased before new data can be written or rewritten to the page. It is further understood that within data there may be errors in content resulting from, but not limited to, data bits being flipped (ones are exchanged for zeroes, or vice versa), data being inaccurate, or some data being invalid.

Further, the inherent reliability of flash data may often be affected by a number of factors including: read disturbs, program disturbs, endurance, etc. In some instances bad block management (BBM), wear leveling (WL), and error correction efforts (such as error correction checking [ECC]) are engaged to assist in checking for errors after writing to a page.

BBM is required as bad blocks may result during usage following erase fails, program fails, and read fails. WL is required as a result of each block within a NAND flash having a limited life (i.e., erase count or endurance limit); by example, though a Single-Level Cell (SLC) flash may typically outperform a Multi-Level Cell (MLC) flash by being faster from using a simpler control logic with 1 bit versus the 2 bits used by MLC flash, the lifespan (i.e. endurance) of the SLC chip is often rated at ten times that of the MLC chip's rating of 10 k write/erase cycles per cell. Similarly, while ECC, in various competencies, is often used to detect and correct the presence of errors to reconstruct the original, error-free data within certain limits, errors may still result even with address correction logic present and often strict error correction approaches may require additional time which thereby further constrains performance.

For instance, in traditional operating systems, software is often a means for determining whether a page has been written to or not and therefore whether the page is available for being written to or not with new data. Operationally, for a typical 4 kB page, the software will read from the flash device and then store a target page in a temporary location. Thereafter, a count of the number of ones (i.e., data bits having the value "1") resident on the page is performed, where if the cumulative total of data indicates ones totaling 4 kB, then the software can determine that the page is available for writing as the page has been erased of prior data or similar. Contradistinctively, if the cumulative total of data indicates ones totaling less than 4 kB, then the software may conclude that the page is not available for writing as the page has not been erased of prior data or similar even though the page may have been erased, as the discrepancy may have arisen from errors associated with the flash data (i.e., read disturbance, etc.). This approach, and particularly those that may read a byte at a time, are understood and recognized to be time-intensive processes resulting in overall performance impacts that are not desirable.

Similarly, it is understood that a hardware-based approach may also involve reading a page for the presence of data having ones, where if the number of ones on a page is equal to the number of bits sought for the page, an indication that the page has been erased is set forth. In contrast, if the number of ones on a page is not equal to the number of bits sought for the page, an indication that the page has not been erased is determined. This approach often involves reading a byte at a time with reduced performance that are not desirable.

However, since flash devices are inherently erroneous and subject to read disturbances, bits may be flipped more often than is desired such that the approaches in software or in hardware are too time-intensive to implement. Though both prior approaches seek a similar outcome, each may yield a determination that the data of a target page has not been erased when it actually has been, simply because certain data bits of one were flipped to zero. Other attempts may also then seek to have a controller having error correction logic that is able to check the validity of the page. Unfortunately, even after data is written to a flash with error correction (such that when the data of the page is read back that data can be corrected when in error because of the error correction), checking for the correctness or errors associated with the page data requires additional time-intensive processing.

Many of these prior approaches add additional overhead and further limit the utility of the system capacity.

As a result, it is desirable to mitigate the impact of errors and the need to seek additional time-intensive processing, particularly on a bit by bit basis, in order to determine the availability of page to have data written to it, preferably without having to undergo additional time-intensive processing steps.

Rather what is needed is a method and system to determine whether a target page of a particular device is available to be written to in relation to error performances associated with the particular device without having to undergo additional time-intensive processing steps or bit by bit data assessment of a target page.

As used herein the term "NAND-based architecture" is intended to include those architectures and techniques for memory devices, systems and peripherals which are organized into a plurality of blocks where each block comprises a plurality of pages and each page typically defines an individually addressable physical memory location. Further "NAND-based architectures" are also intended to include any memory architecture, including implementations, in which read disturbance(s) or disturbance events resulting from retrieval of data may occur.

FIG. 1 sets forth diagrammatic overview of a NAND-based array 100. From the example of FIG. 1, the array (100) has 1024 k pages (120) which are approximately 8192 blocks. A block, within the array has 128 pages, of 528 k bytes. In general, for such an exemplary array, 1 page typically has (4 k+128) bytes; each block has (4 k+128) bytes by 128 pages equivalent to (512 k+16 k) bytes; and each device has (4 k+128) bytes by 128 pages by 8192 blocks or approximately 33,792 Mbits of data.

Further from FIG. 1, a page register (140) has 4 k bytes (at 150) plus 128 bytes (at 160) for information such as error code storage and related detail. Each NAND page has sectors within the page.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment.

SUMMARY OF THE INVENTION

In a first aspect a method and system for detecting an erased page for a device having a NAND-based flash memory is disclosed. The method and system comprises reading a target page of the flash memory, identifying target page data error of the target page as being correctable or uncorrectable; and summing a cumulative number of data bits of the target page having a value of zero. The method and system further includes, comparing the cumulative number to a device threshold value associated with the device; and determining the target page as being the erased page when both the cumulative number is less than the device threshold value and the data error is identified as being uncorrectable.

In another aspect, a method and system for determining availability of writing to a target page of a device having a flash memory with a NAND-based architecture is disclosed. The method and system comprises reading a target page of the flash memory having an identifying block address and a page address; and identifying target page data error of the target page as being correctable or uncorrectable in response to analyzing of error correction codes of one or more sectors of the target page. The method and system further comprises summing a cumulative number of data bits of the target page having a value of zero; and comparing the cumulative number to a device threshold value associated with performance characteristics of the device. Finally the method and system includes determining either: i) the target page is available to be written to, or ii) the target page is unavailable to be written to.

In a third aspect a flash memory system having a NAND-based architecture configured for determining availability of writing to a target page thereof is disclosed. The memory system comprises a memory device coupled to a memory controller, wherein the memory device includes a plurality of non-volatile memory storage cells having at least one target page; an error code checking logic for generating an error code type as being correctable or uncorrectable; a counter logic configured to sum a cumulative number having a value associated with a number of data bits of the target page having a value of zero; and a memory controller. In one or more preferred embodiments, the memory controller is configured to compare the cumulative number to a predetermined threshold value and identify the target page as being either: i) available when both the cumulative number is less than the predetermined threshold value and the error code type is identified as being uncorrectable, or ii) not available when either the cumulative number is not less than the predetermined threshold value or the error code type is identified as being correctable.

The present invention provides for a solution benefiting from providing for a method and system to reduce the impact of inherent flash errors while providing improved system performance through optimized activities with limited impact to overhead using a predetermined threshold value or threshold device value. The present invention provides for a highly effective method for determining the availability of a page, having a block address and page address, to be identified as being available or unavailable for being written to.

Further embodiments, forms, objects, features, advantages, aspects, and benefits of the present application shall become apparent from the detailed description and drawings included herein.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
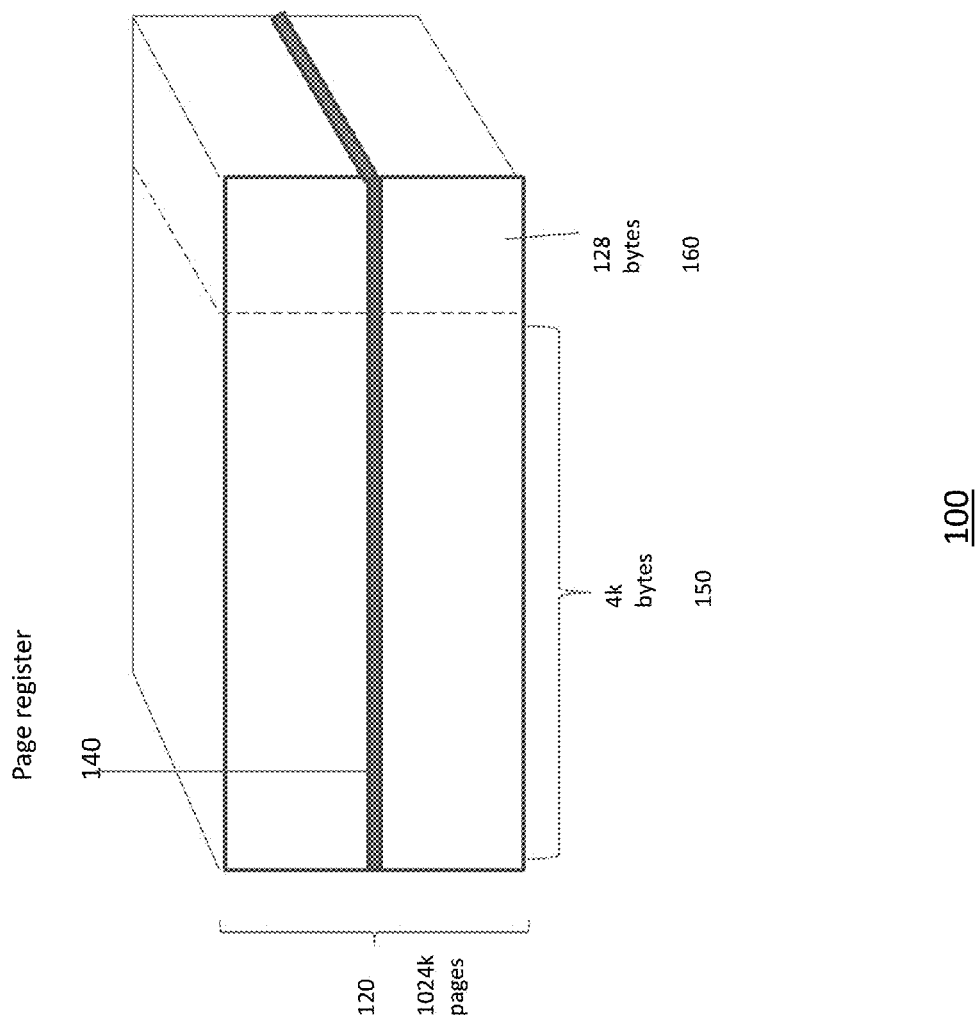
FIG. 1 is an example of a NAND-based array.
Figure 2:
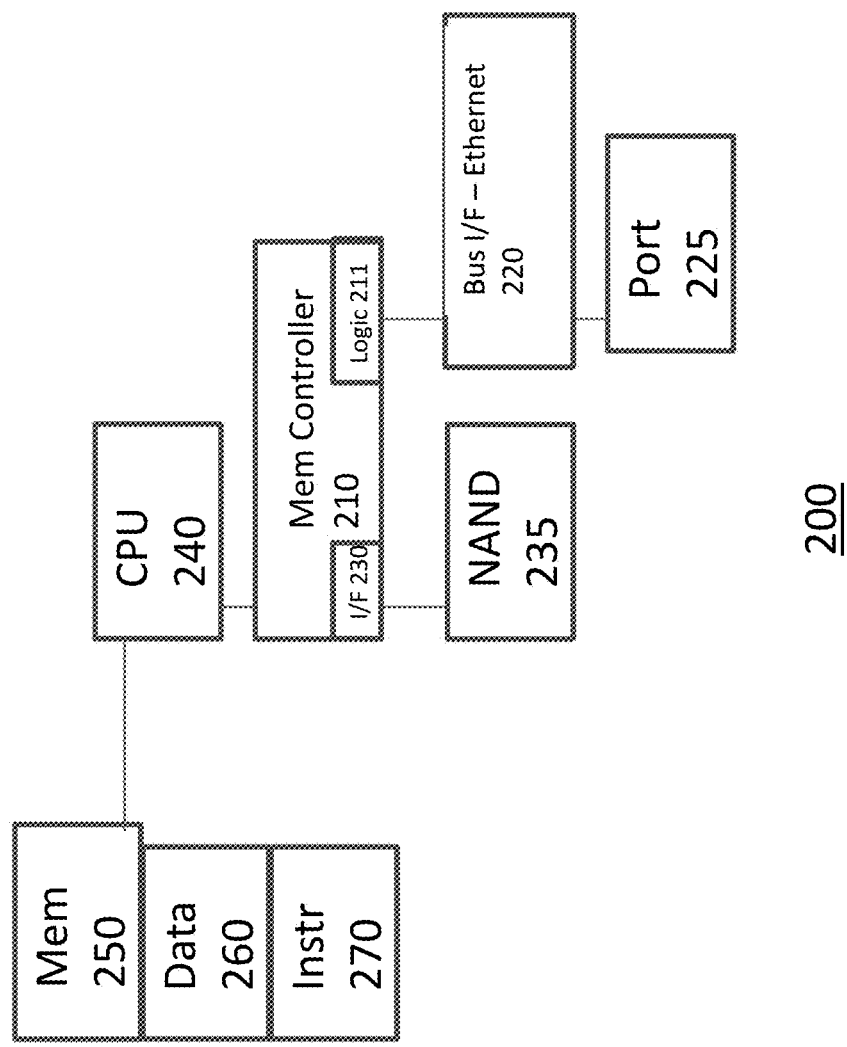
FIG. 2 sets forth an exemplary block diagram of a NAND flash memory system, in accordance with one embodiment of the present invention.

FIG. 2 sets forth an exemplary block diagram of a NAND flash memory system 200, in accordance with one embodiment of the present invention. From FIG. 2, the system includes a memory controller 210 having logic 211, a bus interface 220 for controlling data exchange to/from external connections 225 and/or busses. The bus interface may include one or more different interfaces. The memory controller may include a NAND flash interface 230 for interfacing with and managing one or more NAND flash memory devices 235. It will be understood by those skilled in the art that for NAND flash devices, read and programming (i.e., writing) operations take place on a page basis.

From FIG. 2, a microprocessor 240 is also in communication with the memory controller 210 and a memory 250 where data 260 and instructions 270 reside. It will be further appreciated that the present invention is not limited to having data and instructions resident as set forth in the figure, where data and instructions may reside locally, remotely, in other logic and memory, or any combination, without traversing from the scope and utility of the present invention.

For NAND-based architecture memory systems, page size within a block is often dependent on the size of the data register included within the flash memory controller 100. Similarly, block size is dependent on the architecture, as blocks comprise pages of data. For NAND-based architectures (i.e., NAND-based architecture flash memories), typical block sizes include: 32 pages of 512+16 bytes each for a block size of 16 KB; 64 pages of 2,048+64 bytes each for a block size of 128 KB; 64 pages of 4,096+128 bytes each for a block size of 256 KB; 128 pages of 4,096+128 bytes each for a block size of 512 KB; etc.

In one or more preferred embodiments of the present invention, the memory controller is also in communication with error code checking logic (also known as error code correction, error correction checking, etc.) or ECC logic. ECC logic provides for generating error corrections for one or more sectors (ECC for the sector(s)) for the data that is read from a target page, be it a target page of the memory or a device having a system memory. ECC logic also provides for ECC of the page when the page is first read or written to, which may be associated with ECC for the page (or page ECC). The present invention provides for the analyzing of the generated ECC of the one or more sectors with the ECC of the page (i.e., stored ECC, page ECC, or stored ECC word), where as a result of the analysis, it can be determined that the error type associated with the target page is one of either being a correctable error (CERR) or an uncorrectable error (UNCE). Where the error type is determined to be a CERR, it is more than likely that the target page is not ready to be written to as there may exist a favorable pattern of data suggesting that data has not been erased. Contradistinctively, if it is determined that the error type is an UNCE, then the target page may be further considered as possibly being available to be written to, subject to further evaluation.

The present invention may incorporate error correction checking ECC as single bit error detection and other varied forms as well, including but not limited to two, three and four bit detection. Typically, ECC may be utilized via a 'hashing' algorithm though such is not required by the present invention.

The memory controller, using the method of the present invention in one or more embodiments, determines if the device threshold value (also used as the predetermined threshold value) has been exceeded by the number of data bits of the target page that have a value of zero (i.e., data bits which are not ones). Where the error type was earlier determined that to be of a UNCE type, and where the total number of data bits of the target page that have a value of zero is less than the threshold value, then the target page is deemed as being available to be written to.

In one or more embodiments, the threshold value is determined by the present invention in relation to characteristics of the device, the system memory, or errors often associated with the application, use or performance of the flash memory. For instance, in a device which is known to have a moderate error rate, in part due to read disturbance errors for instance, the threshold value for a single target page may be on the order of 25 data bits. In this manner, using the present invention, where the cumulative count of data bits that have a value of zero that have a value of zero is less than 25, it is determined that the target page is erased and that resulting cumulative counts of data bits are the result of inherent errors and similar.

By further example, in a device which is known to have a lower error rate, in part due to read disturbance errors for instance, the threshold value for a single target page may be on the order of 10 data bits. In this manner, using the present invention, where the cumulative count of data bits that have a value of zero is greater than 10, it is determined that the target page is likely not erased and that resulting cumulative counts of data bits have identified a pattern of likely valid data which has not been previously erased; as a result, the target page is not available for being written to.

The threshold value may also be available from a database or remote source, for instance.

It will be appreciated that the present invention may implement threshold values which are based on single, unique, or a variety of characteristics or factors in order to determine a threshold value associated with a system memory, device or performance.

Figure 3:
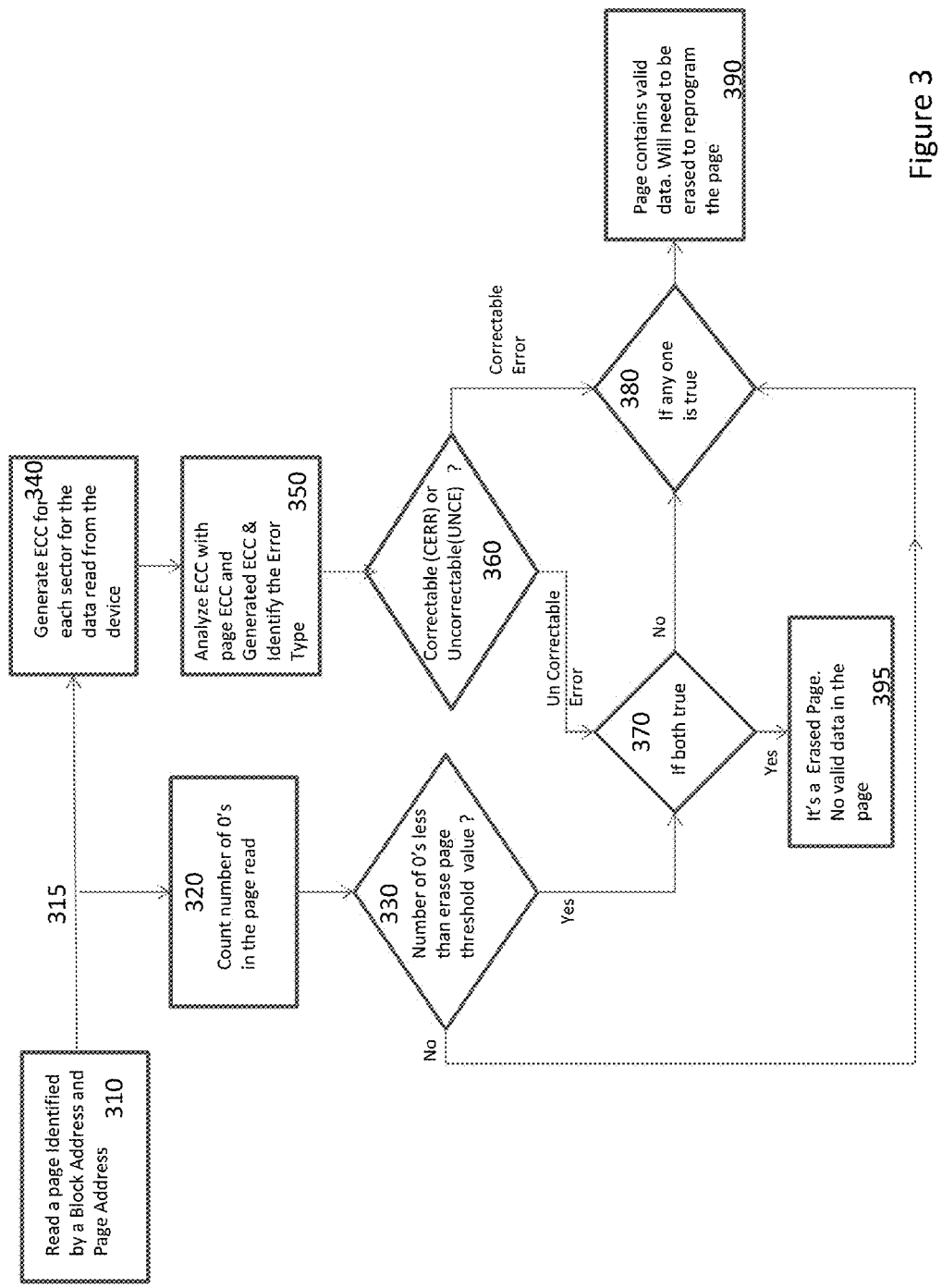
FIG. 3 illustrates a process decision flow for the present invention in accordance with one or more embodiments.

FIG. 3 illustrates a process decision flow 300 for the present invention in accordance with one or more embodiments.

In FIG. 3, a target page of a block is read at 310, where the target page is associated with a particular block address and page address. At 315, logic of the present invention is implemented to perform counts of data bits that have a value of zero for the target page and an error correction checking operation is initiated. At 320, data bits of the target page are assessed as having a having a value of one or zero, and where the assessed data bit has a value of zero, it is counted during the read. The data bits of the target page having zero bits are cumulatively counted to a number value at 320.

At 330, the cumulative count value of data bits having a zero value is compared with the threshold value associated with the device, system, application or predetermined value, where if the cumulative count value is less than the threshold value, the present invention determines that there is the potential for the target page to be available for writing subject to a further evaluation at 370. Conversely, if the cumulative count value is more than the threshold value, the present invention determines that there is not the potential for the target page to be available for writing and it is passed to 380.

At 340, an error correction checking for one or more sectors of the target page is performed for the data read of the target page. The sector ECC is then analyzed at 350 with the page ECC so that the error type of identified errors during the read may be determined as being one of a correctable error or an uncorrectable error. A correctable error may set forth a pattern indicating that the target page data was not erased. An uncorrectable error may not set forth a pattern and may reflect information that is not written data, indicating that the data of the target page is likely not essential, may be due to inherencies errors, and not part of a data pattern, so that the target page is likely available for being written to. If the data error type is determined to be correctable at 360, then it is further processed at 380. If the data error type is determined to be uncorrectable at 360, then it is further processed at 370.

At 370, information is received that the cumulative count is less than the threshold value and that the error type resulting from the comparison of the ECC checks resulted in an uncorrectable error (UNCE). At 370, upon the valid occurrence of both of these events, the present invention determines that the target page is an erased page and that it is therefore available for being written to at 395. In the event one of the conditions precedent is not valid, the information is passed for further processing at 380.

At 380, information is received that both the cumulative count being less than the threshold value and that the error type resulting from the comparison of the ECC checks resulted in an uncorrectable error (UNCE) did not both occur. At 380, the present invention determines that the target page is not an erased page and that it is therefore not available for being written to at 390.

In one or more preferred embodiments, the memory controller is comprised of one or more of hardware, software and firmware. For instance, the present invention may reside in the logic of the memory controller, be programmable, be in remotely located logic, be instructions in a memory or CPU, or be a combination of hardware, software and firmware, or any of the above, in communication with one another.

Additional benefits of the present invention include that by using an early migration strategy with the present invention for a NAND-based architecture device, other pages may be delayed in their migration and could be subject to a new write or replacement prior to a required or batch move, thereby avoiding the situation of moving invalid data and using resources unnecessarily.

Threshold characteristics that may be considered for determining a threshold value may include, but not require, data associated with endurance limit value data, manufacturer's specification information, and similar relevant specification based information about the device, system, application, or similar.

It will be appreciated to those skilled in the art having the benefit of this disclosure that this invention is believed to provide an improved flash memory device within improved performance and reliability. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

Although the present invention has set forth a number of embodiments which may discuss NAND-based architectures, flash memories, non-volatile memories, etc., the present invention further contemplates and includes methods, applications, systems, apparatuses and memory devices in conjunction with other types of memories based on such formats such as static RAMs (SRAM) and the many different subspecies of DRAMs, including, by way of non-limiting examples, fast page mode DRAM (FPM DRAM), extended data out DRAM (EDO DRAM), burst EDO DRAM, synchronous DRAM (SDRAM), double data rate DRAM (DDR2 DRAM and DDR3 DRAM), Rambus DRAM (RDRAM), etc.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read. Various forms of computer readable media may be involved in carrying one or more sequences of one or more instructions to one or more processors in one or more preferred embodiments for execution.

What is claimed is:

1. A method of detecting an erased page for a device having a NAND based flash memory, the method comprising the steps of:
    reading a target page of the flash memory;
    identifying target page data error of the target page as being correctable or uncorrectable;
    identifying data bits of the target page that have a value of zero and summing a cumulative number of data bits of the target page that have a value of zero;
    comparing the cumulative number to a device threshold value for an erased page associated with the device wherein the device threshold value is a value of an acceptable maximum number of data bits of the target page that have a value of zero for the device; and
    determining the target page as being the erased page when both the cumulative number is less than the device threshold value and the data error is identified as being uncorrectable.

2. The method of claim 1, wherein the target page further includes a block address and a page address.

3. The method of claim 1, wherein the device threshold value is associated with one or more performance characteristics of the device.

4. The method of claim 3, wherein reading the target page further includes generating the error correction code of the target page and generating the error correction code of one or more sectors of the target page.

5. The method of claim 1, wherein the identification of target page data error as being correctable or uncorrectable further includes analyzing the error correction code of the sectors of the target page to determine an error condition to determine an error correction type.

6. The method of claim 5, wherein generating the error correction code of the target page further includes validating the target page using error correction logic.

7. The method of claim 5, wherein the summing a cumulative number of data bits of the target page that have a value of zero further includes counting only target page data bits having a value of zero.

8. The method of claim 5, further comprising determining the target page as being unavailable for writing when either the cumulative number is not less than the device threshold value or the data of the target page is identified as being of a correctable error type.

9. The method of claim 8, wherein the cumulative number is greater than 20 and the device threshold value is equal to or less than 20.

10. A method of determining availability of writing to a target page of a device having a NAND-based flash memory, the method comprising the steps of:
    reading a target page of the flash memory having an identifying block address and a page address;
    identifying target page data error of the target page as being correctable or uncorrectable in response to analyzing of error correction codes of the target page and error correction checking of one or more sectors of the target page;

identifying data bits of the target page that have a value of zero and summing a cumulative number of data bits of the target page having a value of zero;

comparing the cumulative number to a device threshold value for an erased page associated with performance characteristics of the device, wherein the device threshold value is a value of an acceptable maximum number of data bits of the target page that have a value of zero for the device; and determining either: i) the target page is available to be written to, or ii) the target page is unavailable to be written to; and wherein i) the target page is determined to be available to be written to as the target page is an erased page where both the cumulative number is less than the device threshold value and the data error is identified as being uncorrectable, and ii) the target page is determined to be unavailable to be written to as the target page is not an erased page as either the cumulative number is not less than the device threshold value or the data error is identified as being correctable.

11. The method of claim 10, wherein the device threshold value is associated with one or more performance characteristics of the device.

12. The method of claim 10, wherein the summing a cumulative number of data bits of the target page that have a value of zero further includes counting only target page data bits having a value of zero.

13. The method of claim 12, wherein the cumulative number is less than the device threshold value.

14. The method of claim 12, further comprising determining the target page as being unavailable for writing when either the cumulative number is not less than the device threshold value or the data of the target page is identified as being of a correctable error type.

15. The method of claim 14, wherein the cumulative number is more than the device threshold value.

16. A flash memory system having a NAND-based architecture comprising:
    a memory device coupled to a memory controller, wherein the memory device includes a plurality of non-volatile memory storage cells having at least one target page;
    an error code checking logic for generating an error code type as being correctable or uncorrectable;
    a counter logic configured to identify data bits of the target page that have a value of zero and sum a cumulative number of data bits of the target page having a value of zero;
    the memory controller configured to compare the cumulative number to a predetermined threshold value for an erased page, wherein the device threshold value is a value of an acceptable maximum number of data bits of the target page that have a value of zero for the device and identify the target page as being either: i) available when both the cumulative number is less than the predetermined threshold value and the error code type is identified as being uncorrectable, or ii) not available when either the cumulative number is not less than the predetermined threshold value or the error code type is identified as being correctable.

17. The flash memory system of claim 16, wherein the generated error code checking logic further determines a first error code type of the target page and a second error code type of one or more sectors of the target page, wherein the target page has with an block address and a page address associated therewith.

18. The flash memory system of claim 17, wherein the memory controller further compares the first error code type and the second error code type to determine a final error type of the target page as being either correctable or uncorrectable.

19. The flash memory system of claim 18, wherein the cumulative number is less than the predetermined threshold value and the target page is deemed available.

20. The flash memory system of claim 18, wherein the target page is determined to be unavailable for writing where the cumulative number is more than the predetermined threshold value.

21. The flash memory system of claim 18, wherein the memory controller is comprised of one or more of hardware, software and firmware.

22. The flash system of claim 18, wherein the memory controller is a programmable controller.

23. The flash memory system of claim 18, wherein the flash memory system is one of a: memory card, Universal Serial Bus (USB) flash drive, solid-state drive, flash memory module, personal computer, PDA, digital audio player, digital camera, mobile phone, synthesizer, solid state storage, video game, scientific instrumentation, industrial robotic device, medical electronic apparatus, and router.

* * * * *